United States Patent
Kolanek et al.

(10) Patent No.: US 6,215,354 B1
(45) Date of Patent: Apr. 10, 2001

(54) CLOSED LOOP CALIBRATION FOR AN AMPLITUDE RECONSTRUCTION AMPLIFIER

(75) Inventors: James C. Kolanek, Goleta; John J. Shynk; Behshad Baseghi, both of Santa Barbara, all of CA (US)

(73) Assignee: Fujant, Inc., Carpinteria, CA (US)

( * ) Notice: Subject to any disclaimer, the term of this patent is extended or adjusted under 35 U.S.C. 154(b) by 0 days.

(21) Appl. No.: 09/245,504

(22) Filed: Feb. 5, 1999

Related U.S. Application Data

(63) Continuation-in-part of application No. 09/036,372, filed on Mar. 6, 1998, now Pat. No. 5,886,573.

(51) Int. Cl.[7] .................................................. H03F 3/191
(52) U.S. Cl. .............................. 330/2; 330/304; 330/126
(58) Field of Search ................................. 330/2, 124 R, 330/126, 149, 304

(56) References Cited

U.S. PATENT DOCUMENTS

| | | | |
|---|---|---|---|
| 5,500,626 | * | 3/1996 | Barclay ................................ 330/2 X |
| 5,886,573 | * | 3/1999 | Kolanek ................................ 330/10 |
| 5,955,917 | * | 9/1999 | Mandell et al. ...................... 330/2 |

* cited by examiner

*Primary Examiner*—Steven J. Mottola
(74) *Attorney, Agent, or Firm*—Blakely, Sokoloff, Taylor & Zafman LLP

(57) ABSTRACT

A calibration method and apparatus for calibrating and linearizing an amplifier in which an input signal is decomposed into N channels. Then the amplifier is modeled to generate an estimated amplifier transfer function for each channel. Using the estimated amplifier transfer function for each channel, equalizer values are computed for equalizers that are applied to each channel prior to amplification, thus enabling the amplification of amplitude and/or phase modulated signals via the non-linear amplifiers.

18 Claims, 8 Drawing Sheets

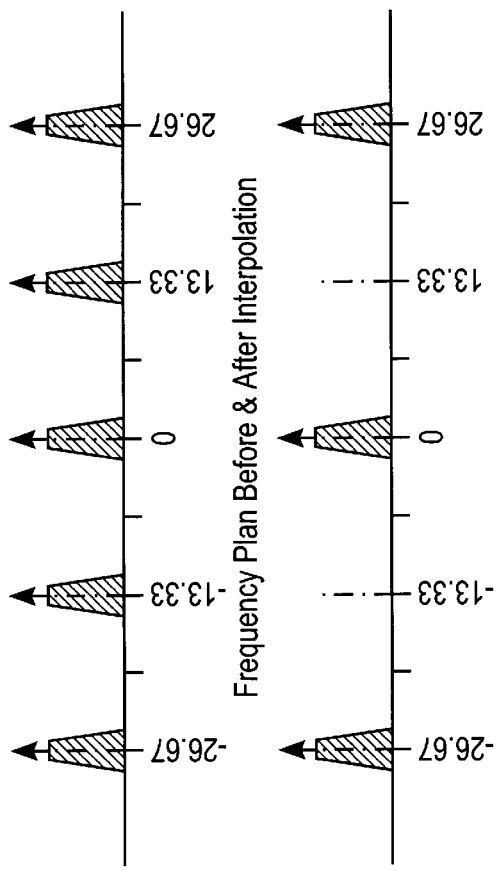
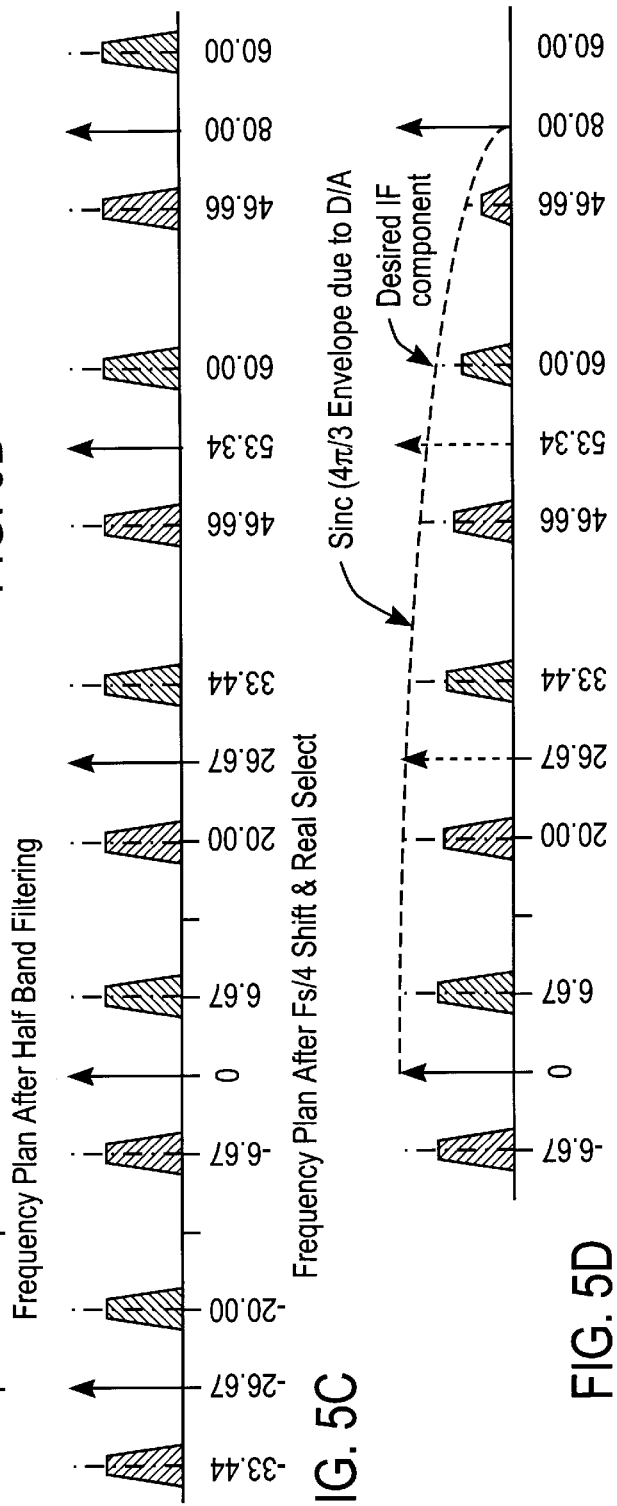
FIG. 5A
FIG. 5B
FIG. 5C
FIG. 5D

CLOSED LOOP CALIBRATION FOR AN AMPLITUDE RECONSTRUCTION AMPLIFIER

This application is a continuation-in-part application of application Ser. No. 09/036,372, entitled "Amplification Using Amplitude Reconstruction of Amplitude and/or Angle Modulated Carrier", filed Mar. 6, 1998, now U.S. Pat. No. 5,886,573 issued Mar. 23, 1999 and assigned to the corporate assignee of the present invention.

FIELD OF THE INVENTION

The present invention relates to the field of signal amplification; more particularly, the present invention relates to amplifying multiple radio frequency (RF) carrier signals with saturated or nearly saturated amplifiers with low distortion meeting the requirements of many cellular or wireless communication systems such as, for example, those meeting AMPS, TDMA, GSM and CDMA requirements.

BACKGROUND OF THE INVENTION

Cellular telephone systems are an important example of a mobile communication system. Cellular mobile telephone systems may be categorized according to those using analog modulation and those using digital modulation. One of the most widely used cellular telephone system is commonly known as the Advanced Mobile Phone System (AMPS).

An AMPS cellular telephone system typically includes a mobile telecommunication switching office (MTSO), a number of base stations (cell sites), a data link network, optional repeaters and converters, and mobile subscriber units (e.g., mobile phones). The MTSO is a special purpose switch that connects calls between mobile units and a landline telephone network. The MTSO functions to assign a voice channel to each base station. The data link network carries data between the base stations and the MTSO, and may include wired or wireless communication links. Each base station typically comprises an antenna, a controller and a number of transceivers. The controller handles the process of connecting a call between the switching system and the mobile units via a set-up channel. A mobile unit comprises a transceiver and a control unit to perform two-way communication.

These telephone systems often employ modems to transfer information between the MTSO and the transceivers. Equalization is commonly performed on a single channel. For instance, single channel equalization is often used in modems to reduce distortion on the incoming signal due to the effects of the channel. In other words, the equalizer in the modem compensates for the effects of the wire line to the signal receive location.

Other cellular telecommunication systems in use include a time-division multiple-access (TDMA) system and a code-division multiple access (CDMA) system, which are named for the type of digital modulation they employ. The European digital cellular system is known as the Global System for Mobile Communications (GSM). This system uses TDMA modulation. However, CDMA is fast becoming the standard and replacing many TDMA systems. The IS95 North American digital cellular system uses CDMA modulation.

SUMMARY OF THE INVENTION

A calibration method and apparatus for calibrating a linear amplifier is described. One embodiment of the method includes modeling the amplifier channel and the amplifier to generate an estimated amplifier transfer function for each channel in the channel pair. Using the estimated data channel amplifier transfer function for each channel, equalizer values (e.g., coefficient values) are computed for equalizers that are applied to each channel in the channel pair prior to amplification.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

FIGS. 5A, 5B, 5C and 5D illustrate the frequency plan for processing within a digital upconverter and conversion by a digital-to-analog converter.

DETAILED DESCRIPTION

Figure 1:
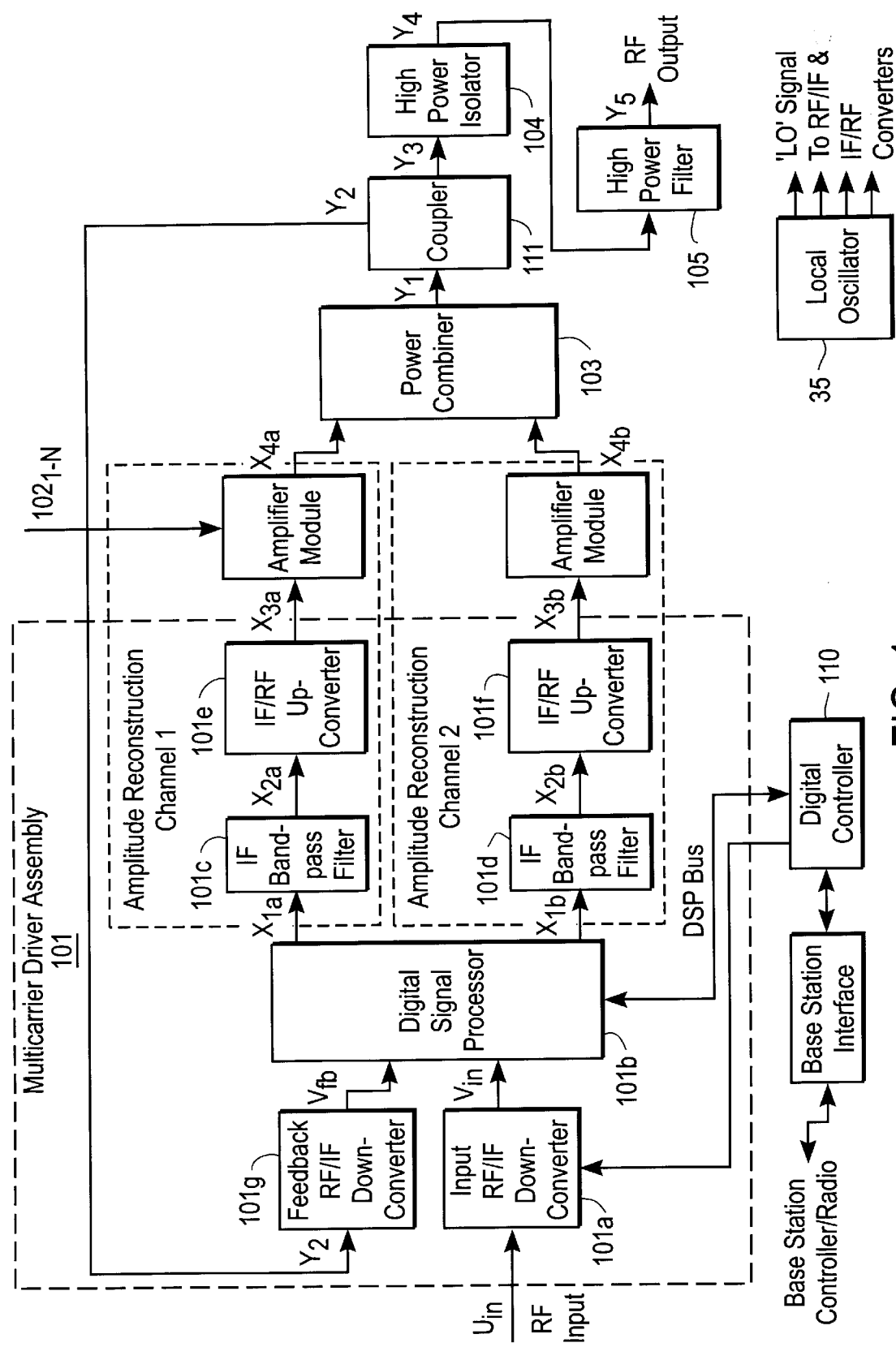
FIG. 1 is a block diagram of a portion of ba station.

A method and apparatus for linearizing saturated or nearly saturated (e.g., approximately 1 db) amplifiers is described. In the following description, numerous details are set forth, such as numbers of amplifiers, protocol types, etc. It will be apparent, however, to one skilled in the art, that the present invention may be practiced without these specific details. In other instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magneto-optical disks, read-only memories (ROMs), random access memories (RAMs), EPROMs, EEPROMs, magnetic or optical cards, or any type of media suitable for storing electronic instructions, and each coupled to a computer system bus. The algorithms and displays presented herein are not inherently related to any particular computer or other apparatus. Various general purpose machines may be used with programs in accordance with the teachings herein, or it may prove convenient to construct more specialized apparatus to perform the required method steps. The required structure for a variety of these machines will appear from the description below. In addition, the present invention is not described with reference to any particular programming language. It will be appreciated that a variety of programming languages may be used to implement the teachings of the invention as described herein.

Overview

The apparatus described herein enables the application of waveforms that require amplifier linearity using amplifiers that are commonly used for frequency modulated waveforms (i.e., saturated amplifiers). The outputs of the amplifiers are combined into a single output signal. In one embodiment, the outputs of amplifier channels (e.g., two channels) are combined into a single output signal. However, any number of channels could be combined.

The amplifier channels are rarely equal to a frequency independent constant gain. Also, the channels may contain filters and other analog components (e.g., unequal path lengths, cable lengths, etc.) that cause distortion in this approach and for which compensation is needed. Therefore, distortion products may appear at the output due to channel unbalance and/or frequency response variations. In one embodiment, equalizers are used to provide the necessary gain, phase and frequency response corrections necessary to balance the channels, thereby improving the linearity and reducing (and maybe even minimizing) distortion. In contrast to the prior art, the equalization is performed digitally before the analog amplifier (i.e., pre-equalization). Thus, the equalizers provide both gain and phase balance as well as provide frequency response corrections to each channel.

To remove distortion products in the output, a process is used to make the response of each channel equal to each other. In one embodiment, a least-squares approach is used to ensure that a high quality signal is achieved when channels are summed together. This is accomplished by modeling the amplifier and selecting equalization based on linear estimates of the amplifier transfer functions. Thus, linear transfer functions of multiple channels are computed simultaneously for use in equalizing the channels.

FIG. 1 is a block diagram of one embodiment of a portion of a base station that amplifies an analog or digital input into an amplified multicarrier output. This high power amplifier may be used as part of a transmitter in a communication system (e.g., a wireless communication system).

Referring to FIG. 1, the base station comprises a multicarrier driver assembly 101, a set of saturated or nearly saturated amplifier modules $102_{1-N}$, and a power combiner 103. The amplifier modules $102_{1-N}$ may comprise the existing equipment of an AMPS base station, such as frequency modulated waveform amplifiers, or saturated (or nearly saturated) amplifiers. To that extent, assembly 101 and combiner 103 are used to retrofit the existing bank of amplifiers. In one embodiment, each amplifier module comprises a pre-driver amplifier, a driver amplifier and the power amplifier. The number of amplifier modules shown is two; however, an embodiment may have one amplifier module or more than two amplifier modules.

Assembly 101 operates as an amplitude reconstruction modulator. The input signal 100 to assembly 101 may be a digital or analog waveform. Input signal 100 may comprise one or more CDMA modulated signals. Multicarrier driver assembly 101 performs amplitude reconstruction modulation. Assembly 101 may perform a combination of pulse duty cycle modulation and/or phase modulation introduced into each path to induce the amplitude modulation to appear at the output of combiner 103. This amplitude modulation at the output of combiner 103 matches the amplitude modulation of the input signal. The pulse duty cycle and phase modulation are introduced in such a way as to not add additional phase modulation to the amplified multicarrier output signal. Thus, the amplitude and phase modulation induced to appear at the output match the amplitude and phase modulation of input signal 100. The resulting output signals from multicarrier driver assembly 101 drive amplifier channels that include saturated or nearly saturated amplifier modules $102_{1-N}$.

Input signal 100 is initially received and downconverted by the input RF/IF down converter 101A which downconverts input signal 100 to an intermediate frequency (IF) signal $V_{in}$. The downconversion allows the input RF signal to be sampled by digital signal processor 101B. In one embodiment, RF/IF downconverter 101A also performs gain adjustment. RF/IF downconverter 101A supplies the IF signal $V_{in}$ to digital signal processor 101B.

In one embodiment, the RF/IF downconverter 101A includes a channel mixer (not shown) to mix input signal 100 with a signal from a common local oscillator (LO), such as local oscillator 35, to convert the input RF frequency signal 101 to an IF frequency range signal. After mixing, such a signal may undergo filtering (not shown) to remove spurious signals resulting from the mixing operation.

Digital signal processor (DSP) 101B samples and processes the IF signal $V_{in}$ to produce amplitude reconstruction signals, $X_{1a}$ and $X_{1b}$, in the case of two amplitude reconstruction channels. When DSP 101B decomposes the IF signal Vin into N channels, then DSP 101B has N outputs. The remainder of this description discusses the case of two channels. It shall be understood that the invention may be generalized to more than two channels.

An interface comprising an IF bandpass filter and an IF/RF upconverter connects each of the amplitude reconstruction signals to amplifier modules $102_{1-N}$.

IF band pass filters 101C and 101D reshape the output of the two amplitude reconstruction signals $X_{1a}$ and $X_{1b}$ to generate filtered amplitude reconstruction signals $X_{2a}$ and $X_{2b}$, respectively. In one embodiment, these filters select the spectral contents that are in the lower half of the interpolated sampled spectrum.

The filtered amplitude reconstruction signals $X_{2a}$ and $X_{2b}$ are received by IF/RF upconverters 101E and 101F. IF/RF upconverters 101E and 101F upconvert the signal received on their input to the required transmit frequency. In one embodiment, IF/RF upconverters 101E and 101F also perform gain adjustment. The upconverted amplitude reconstruction signals $X_{3a}$ and $X_{3b}$ drive the amplifiers in amplifier modules $102_{1-N}$.

In one embodiment, each of IF/RF upconverters 101E and 101F comprises a mixer (not shown) and a filter (not shown). The mixer performs a mixing operation between the filtered amplitude reconstruction signal and a signal from local oscillator 35. The output of the mixer is input to the filter, which processes the results of the mixing operation.

A digital controller 110 implements various signal processing functions. Principally, as discussed in more detail below, digital controller 110 computes the FIR filter equalizer tap coefficients required to adaptively equalize the overall frequency response of the reconstruction channels. In one embodiment, digital controller 110 is coupled to a base station controller/radio via a base station interface.

Amplifier modules $102_{1-N}$ amplify the signals $X_{3a}$ and $X_{3b}$. The outputs of amplifier modules $102_{1-N}$ are coupled to the inputs of power combiner 103. In one embodiment, power combiner 103 linearly combines multiple amplifier outputs via vector recombination of the amplifier output signals to form the desired output signal. The magnitude of the signal at the output of power combiner 103 is dependent on the phase and amplitude of the modulated signals from amplifiers $102_{1-N}$, all of which are always activated. Ideally, the amplitudes of the output signals from amplifier modules $102_{1-N}$ are equal, making the desired output signal dependent only on the duty factor of the pulse modulation and the added phase modulation.

In one embodiment, the results of the combining performed by power combiner 103 may be the input to an isolator 104, via a coupler 111. Isolator 104 prevents leakage from one of the amplifier channels to another through power combiner 103. In this manner, isolator 104 provides a matched impedance for each amplifier and additionally absorbs out of band spectral sidelobes that might have been introduced by duty cycle modulation.

Isolator 104 generates an output that may be input to a high-power filter 105. Filter 105 may perform a band-limiting filtering operation to pass the central frequency components of the output signal from the isolator, while rejecting the spectral sidebands introduced as phase modulation. In one embodiment, filter 105 may impart additional amplitude modulation on its output signal by converting the duty cycle associated with duty cycle modulation into amplitude modulation. The output of filter 105 is the transmitter output.

The output of power combiner 103 is also fed back to the multicarrier driver assembly 101 via coupler 111 as feedback signal $Y_2$. Feedback signal $Y_2$ is only a fraction of the signal output from power combiner 103. The feedback signal $Y_2$ is coupled to the input of feedback RF/IF signal 101G. RF/IF downconverter 101G downconverts feedback signal $Y_2$ to an intermediate frequency (IF) signal $V_{fb}$. In one embodiment, RF/IF downconverter 101G is similar to RF/IF downconverter 101A. RF/IF downconverter 101G supplies the IF signal $V_{fb}$ to digital signal processor 101B.

In one embodiment, RF/IF downconverter 101G includes a channel mixer (not shown) to mix feedback signal $Y_2$ with a signal from a common local oscillator (LO), such as local oscillator 35, to convert it to an IF frequency range signal. After mixing, such a signal may undergo filtering (not shown) to remove spurious signals resulting from the mixing operation.

It should be noted that in the above description, the use of the mixer to combine the signal from the local oscillator with the feedback signal $Y_2$ is necessary where the input frequency signal must be converted to an intermediate frequency range signal. In embodiments where such a conversion is not required, then the mixer and local oscillator may not be needed.

In one embodiment, multicarrier driver assembly 101 comprises software running on a general purpose or dedicated computer system or machine. All or some of multicarrier driver assembly 101 may be implemented in hardware, digital logic, and/or one or more circuits, including integrated circuits (e.g., ASICs).

Figure 2A:
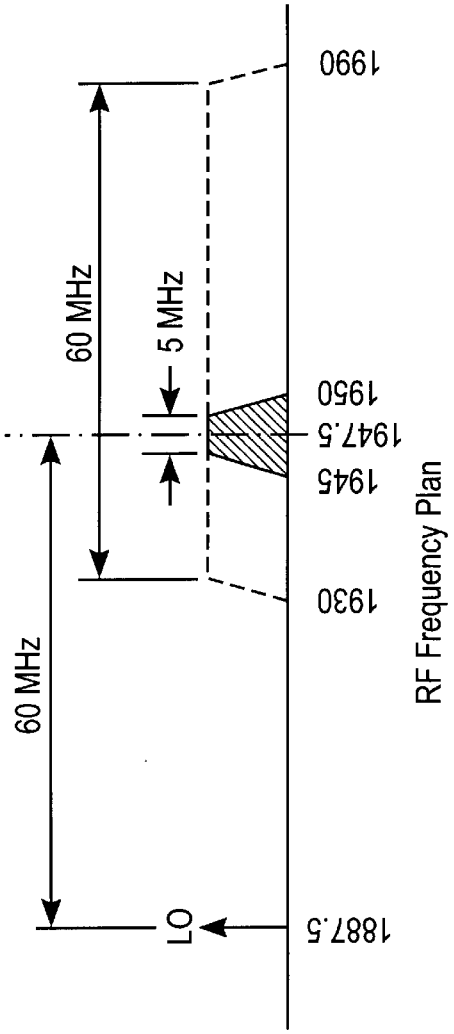
FIGS. 2A, 2B and 2C illustrates the frequency plan for the input and calibration, signals through the output of a digital-to-analog converter.
Figure 2B:
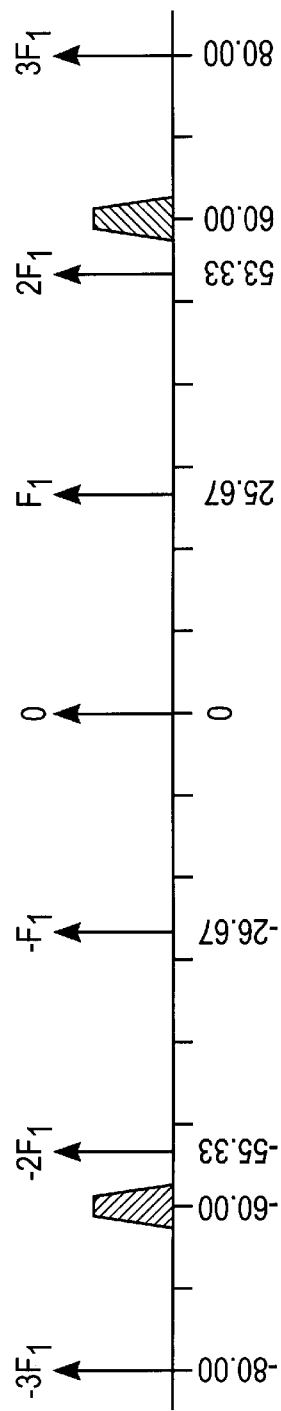
Figure 2C:
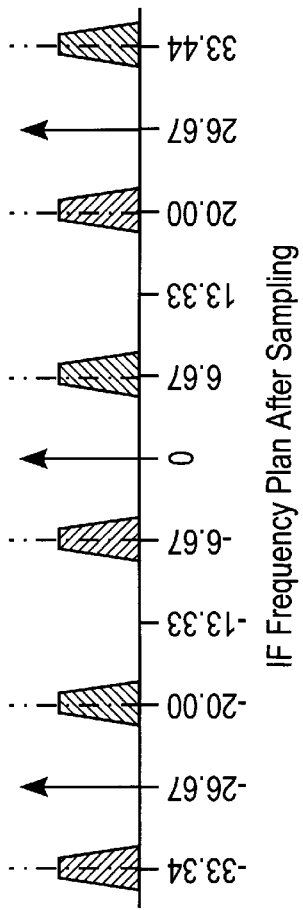

FIG. 2A illustrates an exemplary frequency plan for one such realization. FIG. 2A illustrates the desired input frequency band centered at 1947.5 MHz and a LO at 1887.5 MHz. FIG. 2B illustrates the spectrum after being translated to a 60 MHz IF along with harmonics of the ADC 26.67 MHz sample rate. FIG. 2C illustrates the resulting spectrum after sampling. Note that subharmonic sampling has been employed in this example that allows the sample frequency to be lower than the IF frequency.

Figure 3:
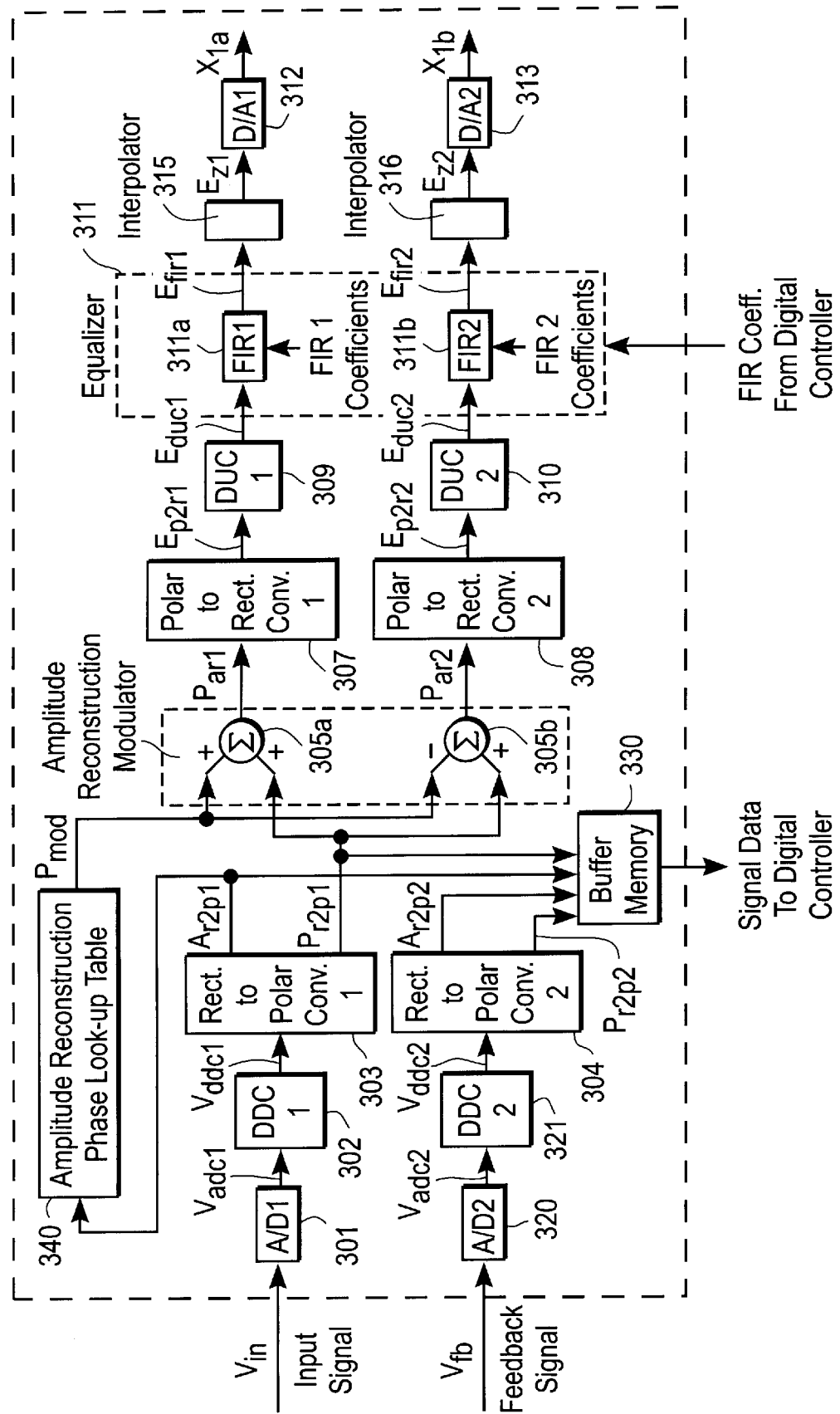
FIG. 3 is a block diagram of a digital processor.

FIG. 3 is a block diagram of one embodiment of the digital signal processor 101B of the multicarrier driver assembly 101. FIGS. 4A–4D illustrate additional detail of the frequency plan, incorporated into the digital signal processor.

Figure 4:
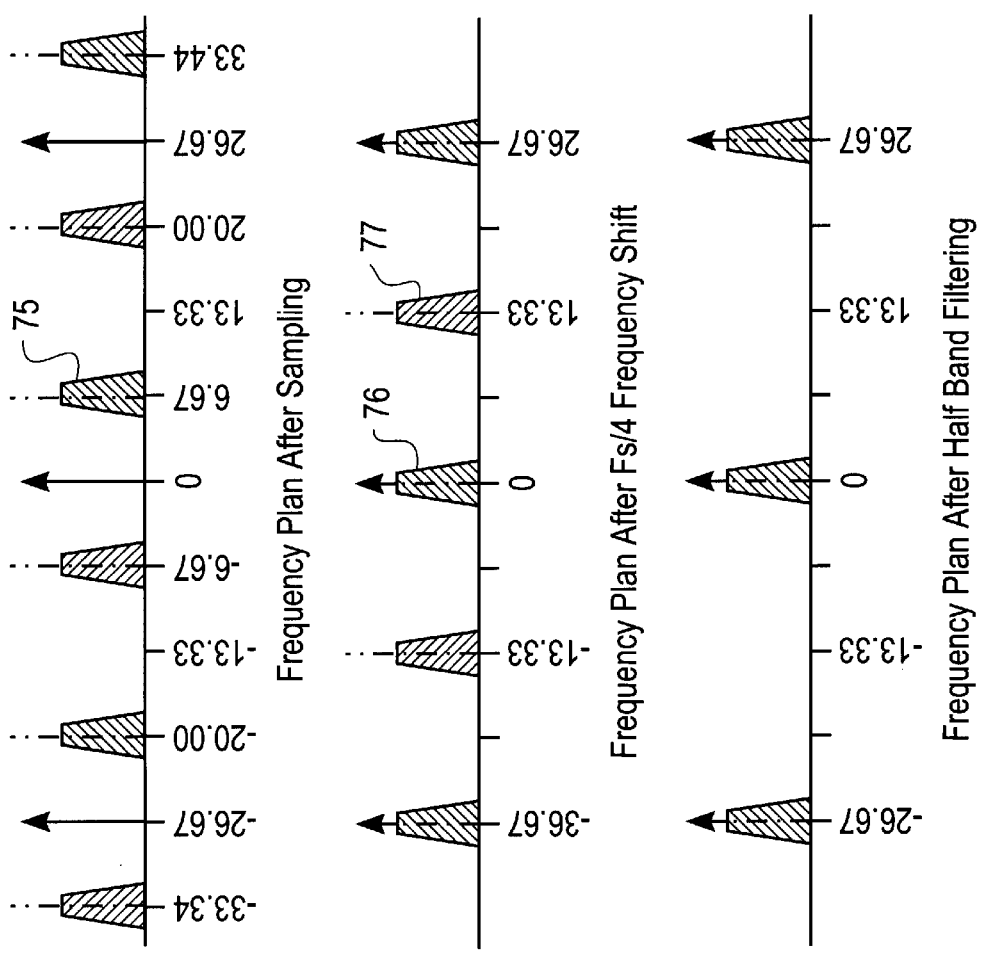
FIGS. 4A, 4B and 4C illustrate the frequency plan for processing within a digital downconverter.

Referring to FIG. 3, the input signal $V_{in}$ is converted by analog-to-digital converter (ADC) 301. The output of ADC 301 is coupled to the inputs of digital downconverter (DDC) 302, which translates the signal frequency (75 of FIG. 4A) by one quarter of the ADC sample rate (i.e., Fs/4) to baseband (76 of FIG. 4B), using a complex frequency translation. DDC 302 also filters this signal to remove the undesired harmonic component at Fs/2 (77 of FIG. 4B) to achieve the frequency plan of FIG. 4C. Thus, DDC 302 converts sampled real signals into complex baseband signals. The output of DDC 302 comprises an in-phase (I) component and a quadrature-phase (Q) component. FIG. 4D shows the resulting signal spectrum. Note that in one embodiment, the output samples could be decimated or interpolated by any factor.

The output of DDC 302 is input into the remainder of FIG. 3 which represents one exemplary embodiment of a linearizer that takes the input signal and converts it to a number of signals that are applied to amplifier modules $102_{1-N}$ in the bank of existing amplifiers. In other words, the linearizer prepares a multicarrier input signal for processing by amplifiers. The amplifiers may be those amplifiers of an existing base station.

This linearizer may include input equalizers (not shown) that equalize amplitude and phase variations that exist and which are common to all channels. In one embodiment, these input equalizers comprise a finite impulse response (FIR) filter that utilizes equalizer filter coefficients in a manner well-known in the art.

Rectangular to polar (R2P) converter 304 converts the rectangular coordinate in-phase (I) and quadrature-phase (Q) input to polar coordinate amplitude and phase format with amplitude and phase components. The phase component represents the angle modulation component of the input signal while the amplitude component represents the envelope modulation component of the input signal.

The phase component is coupled to the input of amplitude reconstruction modulator 305. Amplitude reconstruction modulator 305 is also coupled to receive inputs from amplitude reconstruction phase modulation generation module 340. In one embodiment, the amplitude reconstruction phase modulation generation module 340 comprises an amplitude reconstruction phase look-up table that generates a $P_{mod}$ signal.

In one embodiment, amplitude reconstruction phase modulation generation module 340 generates $P_{mod}$ in response to the amplitude of the input signal output from R2P 304, referred to as $A_{r2p}$, according to the following:

$$P_{mod} = \arccos(A)$$

where $A = \min(A_{r2p}/E_{ref}, 1)$. The value $E_{ref}$ is a predefined reference magnitude. In one embodiment, $E_{ref}$ is the clip value. The operation of the amplitude reconstruction phase modulation generation module 340 provides phase values for setting the angle between the two summing vectors after the amplification. This is used to reconstruct the required amplitude values of the amplitude modulated input signal.

In one embodiment, amplitude reconstruction module 305 supplies the phase modulation $P_{mod}$ to adders 305A and 305B contained therein. Note that $P_{mod}$ is added with adder 305A, while $P_{mod}$ is subtracted with adder 305B. In other words, the amplitude reconstruction modulation comprises a set of phase modulation signals, $P_{ar1}$ and $P_{ar2}$, one for each output channel, and these signals are defined as follows:

$$P_{ar1} = P_{r2p1} + P_{mod}$$
$$P_{ar2} = P_{r2p2} - P_{mod}$$

The net result is to combine two constant amplitude vectors and reconstruct the amplitude modulation present on the input signal.

The phase modulation signals $P_{ar1}$ and $P_{ar2}$ are coupled to a pair of polar to rectangular (P2R) converters 307 and 308. P2R converters 307 and 308 convert the polar coordinate amplitude and phase input signals (the amplifier channel signals) into rectangular in-phase (I) and quadrature-phase (Q) signals.

The outputs of P2R converters 307 and 308 are coupled to a pair of digital upconverters (DUCs) 309 and 310 located in each transmit channel. The transmit I and Q signals for each transmit channel are converted from complex baseband signals to real signals and interpolated by DUCs 309 and 310.

The outputs of DUCs 309 and 310 are coupled to a pair of equalizers 311, which equalize amplitude and phase variations that may exist. In one embodiment, equalizers 311 comprise FIR filters 311a and 311b that operate using equalizer coefficients generated in the manner described below.

The outputs of equalizer 311 are coupled to two interpolators 315 and 316. The outputs of interpolators 315 and 316 are coupled to digital-to-analog converters (DAC) 312 and 313, respectively, which convert the digital signals to analog format. These outputs drive the amplifier channels.

Buffer memory 330 stores synchronously captured consecutive samples from both the input channel ($V_{in}$) and the feedback channel ($V_{fb}$). Buffer memory 330 maintains an association of the samples downloaded to digital controller 110 for use thereby.

ADC 320 and digital downconverter 321 are included to process the feedback signal $V_{fb}$ to produce a sampled feedback signal.

FIGS. 5A–D illustrate a frequency plan for frequency conversion contained within the transmit channels. FIG. 5A shows the frequency plan present at the inputs of DUCs 309 and 310. In one embodiment, DUCs 309 and 310 first interpolate their input signals by inserting zeros between samples to increase the sample rate and then filter their input signals to remove the component at the new Fs/2 where Fs is the new sample rate. FIG. 5B illustrates the frequency plan after half-band filtering. Finally, the signal is quarter-band up-shifted (i.e., Fs/4). FIG. 5C illustrates the frequency plan after the quarter-band (Fs/4) up-shifting and selection of only the real part of the signal to produce the desired spectrum. FIG. 5D illustrates the frequency plan at the D/A output after interpolating by 2 on the input. In an alternative embodiment, polyphase filters are used to further increase the sample rate by interpolation.

It should be noted that some of the digital signal processing operations described herein may be performed in software, hardware, or a combination of the two. Such software may be run on, for example, a dedicated or general purpose machine, such as a computer system, while the hardware may comprise, for example, dedicated logic, circuits, etc. Also, although the above describes an embodiment that performs digital processing in the polar coordinate domain, the processing could be performed in the I and Q (rectangular coordinate) domain.

Calibration Procedure

Figure 6:
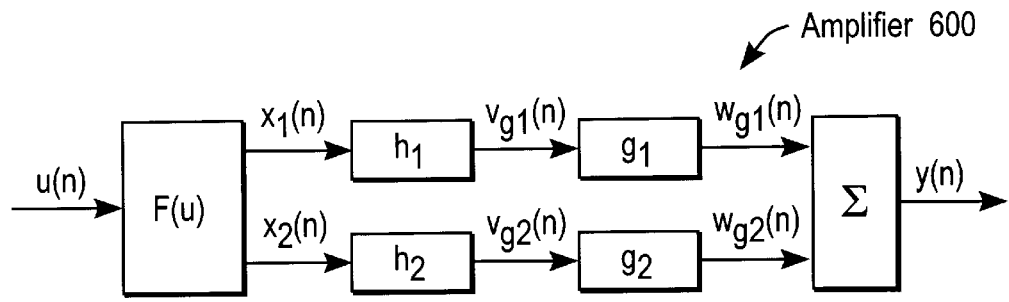
FIG. 6 is a block diagram of a linear amplifier based on the principle of amplitude reconstruction.

A model of a linear amplifier based on the principle of amplitude reconstruction is shown in simplified form in FIG. 6. Note that the individual amplifiers are not necessarily linear; however, by performing this type of reconstruction, the nonlinear effects on the signal amplitude can be substantially reduced and even minimized.

Referring to FIG. 6, an input signal u(n) is coupled to the input of nonlinear function F(u). The nonlinear function F(u) converts the amplitude modulated signal u(n) to N phase modulated signals with constant amplitude. In one embodiment, N is 2. The outputs of the nonlinear function F(u) (defined below) are coupled to a pair of equalizers $h_1$ and $h_2$. In one embodiment, the equalizers $h_1$ and $h_2$ are a pair of finite impulse response (FIR) filters. The outputs of equalizers $h_1$ and $h_2$ are coupled to power amplifiers $g_1$ and $g_2$. In one embodiment, power amplifiers $g_1$ and $g_2$ also include filters, RF upconverters (including RF filters), digital-to-analog converters (DACs), and isolators. The outputs of power amplifiers $g_1$ and $g_2$ are coupled to inputs of a summation block, the output y(n) of which is the output of the linear amplifier. In one embodiment, the function summation block comprises power combiner 103 described above. Note that although not shown, in one embodiment, there are isolators in each path, along with IF and RF filters.

Although FIG. 6 is described with two channels, a decomposition by the non-linear function F(u) may be into N amplitude reconstruction channels. In such a case, the amplifier model will have $\hat{g}_1, \hat{g}_2, \ldots$ and the equalizer will have $h_1, h_2, \ldots, h_N$.

The input signal u(n) is applied to the nonlinear function F(u). The input signal u(n) is a complex baseband input signal $u(n) = a(n) \exp(j\, b(n))$ with amplitude a(n) and phase modulation b(n). In one embodiment, the amplitude a(n) is clipped based on its magnitude. In one embodiment, the clipped amplitude function $\bar{a}(n)$ is as follows:

$$\bar{a}(n) = \begin{cases} a(n), & a(n) < A_{clip} \\ 1, & a(n) \geq A_{clip} \end{cases}$$

where $A_{clip}$ is a predefined clip level which is dependent on the system hardware. In one embodiment, the clip level is 0.7821.

In response to the input signal u(n), the non-linear function F(u) produces a pair of frequency modulated signals $x_1(n)$ and $x_2(n)$. The pair of frequency modulated signals $x_1(n)$ and $x_2(n)$ are given by:

$$x_1(n) = e^{j(b(n)+c(n))}$$

$$x_2(n) = e^{j(b(n)-c(n))}$$

where:

$$c(n) = \cos^{-1}(\bar{a}(n)).$$

The resulting signals $x_1(n)$ and $x_2(n)$ are processed by equalizers $h_1$ and $h_2$ and power amplifiers $g_{g1}$ and $g_{g2}$. The output of the amplifiers, referred to herein as $w_{g1}(n)$ and $w_{g2}(n)$, are summed to generate the output y(n).

If the equalizers $h_1$ and $h_2$ and power amplifiers $g_1$ and $g_2$ in each channel provide constant gain G, then it can be shown that the output y(n) is exactly equal to a scaled and clipped version of u(n). That is, the amplifier acts as an ideal soft-limiting amplifier. If the clip level is not exceeded, then the equivalence is exact. This is shown in the derivation below.

$$y(n) = w_{g1}(n) + w_{g2}(n)$$
$$= G[e^{j(b(n)+c(n))} + e^{j(b(n)-c(n))}]$$
$$= Ge^{j(b(n))}[e^{j(c(n))} + e^{j(-c(n))}]$$
$$= 2Ge^{j(b(n))}\cos(c(n))$$
$$= 2Ge^{j(b(n))}\cos(\cos^{-1}(\bar{a}(n)))$$
$$= 2G\bar{a}(n)e^{j(b(n))}$$
$$\approx 2Ga(n)e^{j(b(n))}$$

Unfortunately, amplifiers $g_1$ and $g_2$ are rarely equal to a frequency independent constant gain G as assumed above. Any differences in the two channels (upper and lower paths) and/or frequency response variations can cause distortion products to appear in the output y(n). In addition, in one embodiment, amplifiers $g_1$ and $g_2$ have the nonlinear characteristic of high-power amplifiers. This latter effect is somewhat mitigated by the fact that amplitude reconstruction relies on constant amplitude signals passing through the high-power stages (i.e., $g_1$ and $g_2$) and consequently the effects of the nonlinearities are generally slight. Equalizers $h_1$ and $h_2$ provide the necessary gain, phase and frequency response corrections necessary to balance the two channels, and the attempt to compensate for the nonlinearities and minimize distortion. In one embodiment, equalizers $h_1$ and $h_2$ are implemented as FIR filters that can, in principle, provide both gain and phase balance as well as compensate for the frequency response of each channel separately.

The overall goal is to make the frequency response of each channel equal to each other and to be as flat as possible over the band of interest (in that there are no dips or spikes or sharp cut-offs, or these are reduced or minimized with respect to each other). This is accomplished by use of adaptive equalizers in an adaptive system that implements two major functions: i) estimation of the amplifier transfer functions (referred to herein as system identification), yielding a linear amplifer system model; and ii) computation of the equalizer coefficients using the amplifier model (referred to herein as adaptive equalization). Also, constraints are used so that the frequency response of each channel is approximtely flat. This may be accomplished in two ways: 1) a least squares constraint for each channel, and 2) a zero-forcing constraint for each channel. The degree to which a constraint contributes to the overall reduction or minimization is controlled by two user-adjustable promoters, $\gamma_1$ greater than or equal to 0 and $\gamma_2$ greater than or equal to 0, where $\gamma_1 + \gamma_2 = 1$.

In contrast to the prior art, the equalization is performed before the amplifier (i.e., pre-equalization). In one embodiment, the equalization is performed in the digital domain before amplification, whereas the amplification is performed in analog. In other words, the purpose of the equalization is to time align, phase align, and magnitude align the signals from the two channels so that an amplified version of the original input signal to the amplifier may be obtained from the summation of the two channels. Also, as described above, in one embodiment, the equalization is performed on the phase component of the amplifier configuration, apart from the amplitude, which is different than the prior art.

A System Identification Process

Figure 7:
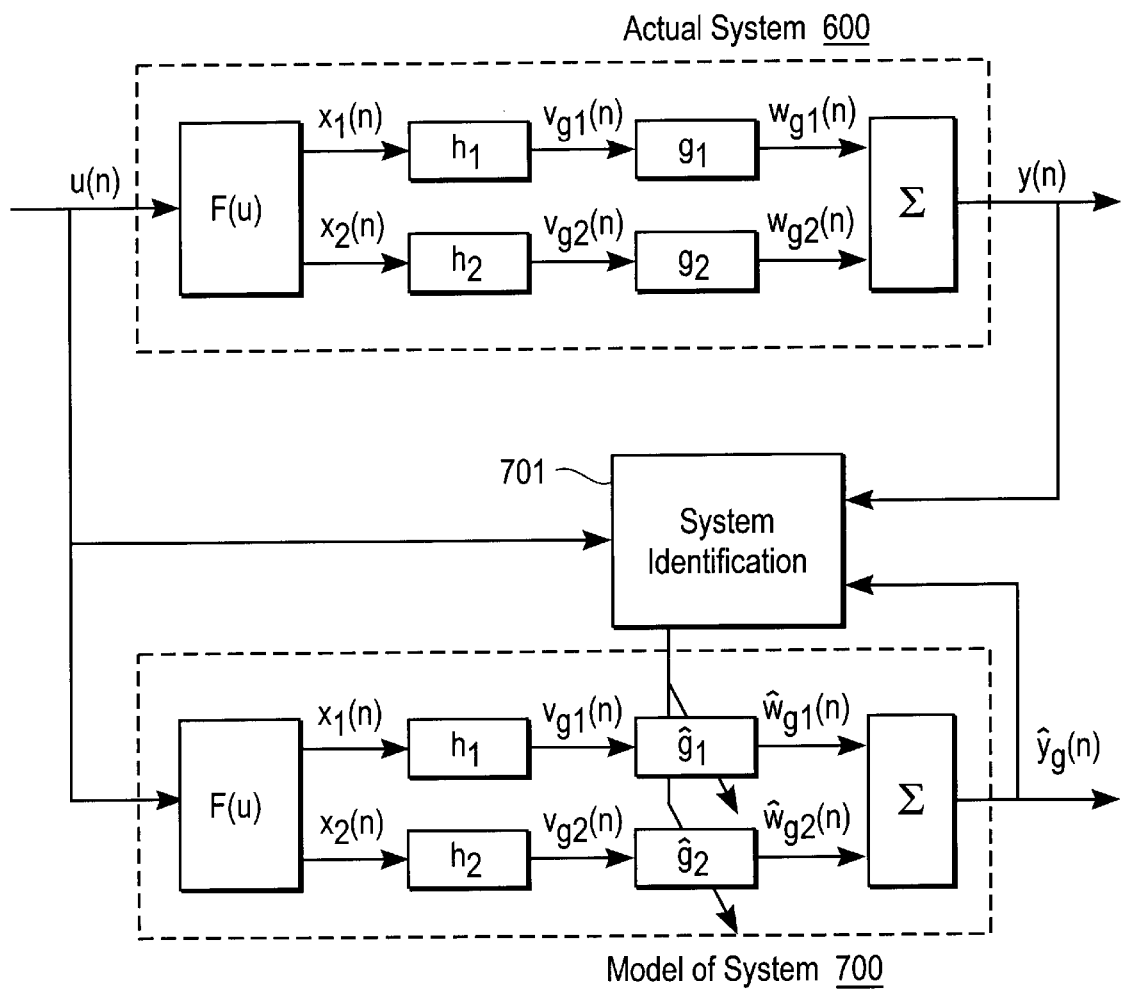
FIG. 7 is a block diagram of an actual amplifier and a model amplifier paired as part of a calibration process.

A calibration scheme based on the principle of linear least squares is shown in FIG. 7. Referring to FIG. 7, actual amplifier 600 shown in FIG. 6 is coupled to a amplifier model 700 having a nonlinear processing function F(u), a pair of equalizers $h_1$ and $h_2$, amplifier models $\hat{g}_1$ and $\hat{g}_2$ (vectors), and a summation block. The nonlinear function F(u) and equalizers $h_1$ and $h_2$ in amplifier model 700 are identical to those in amplifiers 600. However, amplifier models $\hat{g}_1$ and $\hat{g}_2$ (vectors), are only estimates of the actual amplifiers $g_1$ and $g_2$. The actual amplifiers contain nonlinear components that cannot be modeled the FIR filters, and even the linear components may not be sufficiently modeled if the FIR filters do not have enough parameters. This difference may affect the performance of the equalizers because they are generated from the amplifier models, i.e., $h_1$ and $h_2$ attempt to invert the characteristics of $\hat{g}_1$ and $\hat{g}_2$ (vectors), (and not $g_1$ and $g_2$, which are not directly available). Note that some vectors appear in bold.

The nonlinear function F(u) of amplifier model 700 is coupled to receive the same input signal u(n) as actual amplifier 600. A system identification block 701 is coupled to receive the output signal y(n) of actual amplifier 600, the output signal $\hat{y}_g(n)$ of amplifier model 700, and the input signal u(n). In one embodiment, system identification block 701 is part of digital controller 110. In response to these signals, system identification block 701 generates outputs (not shown) to the equalizers of both actual amplifier 600 and amplifier model 700, the nonlinear function F(u) of actual amplifier 600, and the amplifiers of amplifier mocel 700.

Although not shown in FIG. 7, buffers receive samples of the input signal u(n) and capture samples of the outputs of both actual amplifier 600 and amplifier model 700. System identification block 701 accesses these buffers to obtain samples when performing one or more of its functions.

A goal of this least squares technique is to compute equalizers $h_1$ and $h_2$ such that the actual output y(n) matches a delayed version of the input u(n) in the least squares sense (as defined below). In order to achieve this goal, the amplifier models $\hat{g}_1$ and $\hat{g}_2$ are estimated such that $\hat{y}(n)$ matches y(n), also in the least square sense.

Normally, when the equalizers are located ahead of the amplifiers (as in this case), it is difficult to directly compute the least squares estimates because the amplifier characteristics are unknown. The gradient from y(n) to each of the equalizer input signals, $x_1(n)$ and $x_2(n)$, is needed to compute the least squares estimates, but this requires knowledge of the amplifiers. This problem is circumvented by computing a reference model of the amplifiers whereby the actual amplifiers $g_1$ and $g_2$ are estimated by linear filters $\hat{g}_1$ and $\hat{g}_2$ (vectors).

As mentioned above, the amplifier models and the equalizers may be represented by FIR filters. Therefore, the transfer functions of the amplifier models may be written as follows:

$$\hat{G}_1(z) = \sum_{i=0}^{N_g-1} \hat{g}_1(i) z^{-i}$$

$$\hat{G}_2(z) = \sum_{i=0}^{N_g-1} \hat{g}_2(i) z^{-i}$$

where $N_g$ is the number of coefficients in each channel of the model. Similarly, equalizer may be represented as follows:

$$H_1(z) = \sum_{i=0}^{N_e-1} h_{1,i} z^{-i}$$

$$H_2(z) = \sum_{i=0}^{N_e-1} h_{2,i} z^{-i}$$

where $N_e$ is the number of coefficients in each equalizer. Typically, $N_g \geq N_e$ because $N_e$ is restricted by the hardware, whereas $N_g$ can be somewhat arbitrary because it is implemented by the controller. In one embodiment, $N_g=32$ and $N_e=16$, although it is desirable that they be as small as possible.

Referring to FIG. 7, the equalizer outputs referred to as $v_{g1}(n)$ and $v_{g2}(n)$ are given by:

$$v_{g1}(n) = h_1(n)^* x_1(n)$$
$$= \sum_{i=0}^{N_e-1} h_{1,i} x_1(n-i) = x_1^T(n) h_1$$

$$v_{g2}(n) = h_2(n)^* x_2(n)$$
$$= \sum_{i=0}^{N_e-1} h_{2,i} x_2(n-i) = x_2^T(n) h_2$$

where $x_1(n)=[x_1(n), \ldots, x_1(n-N_e+1)]^T$, $x_2(n)=[x_2(n), \ldots, x_2(n-N_e+1)]^T$, $h_1=[h_{1,1}, \ldots, h_{1,e-1}]^T$, $h_2=[h_{2,1}, \ldots, h_{2,Ne-1}]^T$, and *denotes convolution. These can replaced by vector inner products to simplify the notation.

Computing the Amplifier Models

To compute the amplifer models, let $u(n)=[u(n), u(n-1), \ldots, u(n-N_s+1_s)]^T$ be a vector of the size $N_s$ containing the n-th block of samples of the input signal $u(n)$. Similarly, define vectors $y(n)$, $v_{g1}(n)$, $v_{g2}(n)$, $\hat{w}_{g1}(n)$, $\hat{w}_{g2}(n)$ and $\hat{y}_g(n)$, where the vector $y(n)$ comprises the output of actual amplifier 900, the vectors $v_{g1}(n)$ and $v_{v2}(n)$ are the outputs of the equalizers of either actual amplifier 600 or amplifier model 700, the vectors $v_{g1}(n)$ and $v_{g2}(n)$ are the first and second channel amplifier model signals of amplifier model 700, respectively, and the vector $\hat{y}_g(n)$ is the output of amplifier model 700.

The amplifier model signals $\hat{w}_1(n)$ and $\hat{w}_2(n)$ can be expressed in matrix/vector notation as follows:

$$\hat{w}g1(n) = V_{g1}(n) \hat{g}_1$$

$$\hat{w}_{g2}(n) = V_{g2}(n) \hat{g}_2$$

where $V_{g1}(n)$ and $V_{g2}(n)$ are Toeplitz matrices formed using the signal vectors $v_{g1}(n)$ and $v_{g2}(n)$. These matrices may be represented as follows and are only one of many possible ways to store the data for this technique.

$$V_{g1}(k) = \begin{bmatrix} v_{g1}(n) & 0 & 0 \\ v_{g1}(n-1) & v_{g1}(n) & \\ & & \\ V_{g1}(n-{}_0N_s+1) & & \\ 0 & & \end{bmatrix}$$

$$V_{g2}(k) = \begin{bmatrix} v_{g1}(n) & 0 & 0 \\ v_{g2}(n-1) & v_{g2}(n) & \\ & & \\ V_{g2}(n-{}_0N_s+1) & & \\ 0 & & \end{bmatrix}$$

Note that $V_{g1}(n)$ and $V_{g2}(n)$ correspond to the first columns of these matrices, respectively (though zeros have been appended so that the dimensions of the matrices are $((N_s+N_g) \times N_g)$. The output of the amplifier model is given by the following:

$$\hat{y}_g(n) = \hat{w}_{g1}(n) + \hat{w}_{g2}(n)$$

Since the amplifier model in both channels will be estimated simultaneously, it will be convenienct (and more compact) to define the compound coefficient vector $\hat{g}$ (vector)$=[\hat{g}T_1^T, \hat{g}_2^T]^T$ and the compound data matrix $V_g(u)=[V_{g1}(n), V_{g2}(n)]$. Thus, the equation for the output of the amplifier model can be rewritten as:

$$\hat{y}_g(n) = \hat{w}_{g1}(n) + \hat{w}_{g2}(n)$$
$$= V_{g1}(n)\hat{g}_1 + V_{g2}(n)\hat{g}_2$$
$$= [V_{g1}(n), V_{g2}(n)] \begin{bmatrix} \hat{g}_1 \\ \hat{g}_2 \end{bmatrix}$$
$$= V_g(n)\hat{g}$$

with $V_{g1}(n)$ representing the output of one of the two equalizers and $V_{g2}(n)$ representing the other, and $V_g(n)$ representing all of the data for the output of the equalizer. Thus, by this representation, the output of amplifier model 700 is written in terms of the outputs of the equalizers and the amplifier transfer functions.

Let the cost function associated with estimating $\hat{g}_1$ and $\hat{g}_2$ (vectors)

$$C_1(n) = \alpha_1 y(n-p_1) - \hat{y}_g(n-g_2) \|^2$$

where $p_1$ and $p_2$ are delays introduced by the actual amplifiers and the model amplifiers, respectively. For convenience, these are ignored in the derivations below. It is important, however, that they be chosen correctly so that the algorithm will function properly. Note that $\|b\|^2 = b^T b$ corresponds to the norm squared of the vector b. The real-valued parameter $\alpha_1$ compensates for any gain mismatch at the output. Substituting the output of the model amplifiers for $\hat{y}_g(n)$ (vector) (and suppressing $p_1$ and $P_2$) yields $$C_1(n = \|\alpha_1 y(n) - V_g(n)\hat{g}\|^2$$
$$= [\alpha_1 y^T(n) - \hat{g}^T V_g^T(n) \| \alpha_1 y(n) - V_g(n)\hat{g}]$$

Differentiating with respect to ĝ (vector) yields $$\frac{\partial C_1(n)}{\partial \hat{g}} = -2\alpha_1 V_g^T(n)y(n) + 2V_g(n)\hat{g}$$

Solving $\partial C_1(n)/\partial \hat{g}=0$ for ĝ (vector) gives the LS result $$\hat{g}[V_g^T(n)V_g(n)]^{-1}[\alpha_1 V_g^T(n)y(n)] = R_1^{-1}(n)P_1(n)$$

This expression can be rewritten in terms of the individual coefficient vectors as follows:

$$\begin{bmatrix}\hat{g}_1\\\hat{g}_2\end{bmatrix} = \begin{bmatrix}V_{g1}^T(n)V_{g1}(n) & V_{g1}^T(n)V_{g2}(n)\\V_{g2}^T(n)V_{g1}(n) & V_{g2}^T(n)V_{g2}(n)\end{bmatrix}^{-1}\begin{bmatrix}a_1 V_{g1}^T(k)y(n)\\a_1 V_{g2}^T(k)y(n)\end{bmatrix}$$

In practice, a matrix would not be inverted directly as in the expressions above. Instead, Gaussian elimination (GE) (or another efficient method) would be employed to solve the following set of equations:

$$[V_g^T(n)V_g(n)]\hat{g}=[\alpha_1 V_g^T(n)y(n)]$$

Note that the matrix on the left-hand side of the equation above is not Toeplitz (though it is symmetric). Since it is only block Toeplitz, as is evident from the right-hand side of the expression of the LS result (written in terms of individual coefficient vectors), it may not be possible to use a Levinson-type recursion (instead of GE) to solve for ĝ (vector). (For an N×N matrix, GE requires $O(N^2)$ operations, whereas the Levinson algorithm reduces this to $O(N)$.)

Enhanced Equalizer Process

Figure 8:
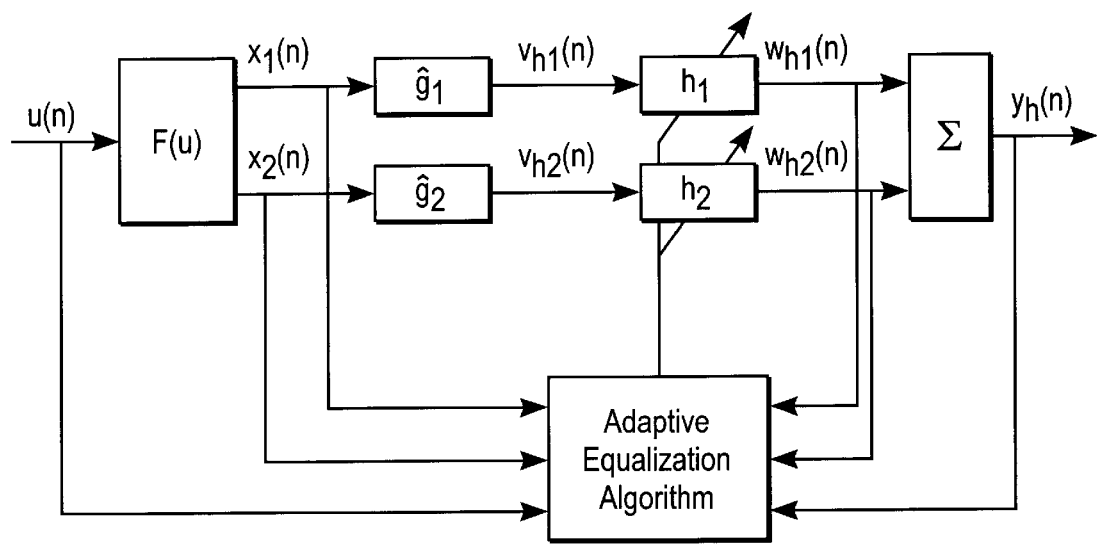
FIG. 8 is a block diagram of the system architecture used when computing the equalizers.

The equalizers $h_1$ and $h_2$ are computed in a manner similar to that used to generate the amplifier models $\hat{g}_1$ and $\hat{g}_2$. A block diagram of the system configuration is shown in FIG. 8. Comparing this system with the model in FIG. 7, observe that the equalizers and the amplifier models are transposed. This can be done without loss of generality because the systems are linear. The input signals $x_1(n)$ and $x_2(n)$ are generated as before, but the intermediate signals following the models and the equalizers are different from before because of this interchange. This change is emphasized by using different notation: $v_{h1}(n)$ and $v_{h2}(n)$ are the output signals of the amplifier models, whereas $w_{h1}(n)$ and $w_{h2}(n)$ are the output signals of the adaptive equalizers. The new cost function for the adaptive equalizer is $$C_2(n)=\gamma_1 C_{21}(n)+(1-\gamma_1)[\gamma_2(C_{22}(n)+C_{23}(n))+(1\gamma y_2)(C_{24}+C_{25})]$$

where the individual components are given by $$C_{21}(n)=\|\alpha_{21}u(n-p_3)-y_h(n-p_2)\|^2$$

$$C_{22}(n)=\|\alpha_{22}x(n-p_3)-w^h(n-p_2)\|^2$$

$$C_{24}=\|\alpha_{24}1-\hat{G}_1 h_1\|^2$$

$$C_{25}=\|\alpha_{25}1-\hat{G}_2 h_2\|^2$$

where 1 is a unit vector; the location of the one depends on the system delays. $C_{21}(n)$ is one embodiment of the cost function for the equalization; minimizing $C_{21}(n)$ alone will yield equalizers such that $y_h(n)$ approximates $u(n)$ in the LS sense. $C_{22}(n)$ and $C_{23}(n)$ are LS constraints for each channel separately; these adjust the equalizers so that the intermediate output signals $w_{h1}(n)$ and $w_{h2}(n)$ approximate the input signals $x_1(n)$ and $x_2(n)$, respectively. Finally, $C_{24}$ and $C_{25}$ are zero-forcing constraints; these adjust the equalizers such that $h_i(n)$ convolved with $\hat{g}(n)$ (i=1,2) yields a (Kronecker) delta function, i.e., $$h_1(n)*\hat{g}_1(n)=\alpha_{21}\delta(n-p_4)$$

The model amplifier delay is $p_2$ (the same as before), $p_3$ is the delay from the input u(n) to $x_1(n)$ (and $x_2(n)$), and $p_4$ is the effective (group) delay of the left-hand side of (1). (Note that all the $p_i$, i=1, 2, 3, 4 refer back to the input u(n).) For convenience, the delays are suppressed in the derivations below. The $\alpha_{ij}$ are scalar constants included to compensate for any gain mismatches among the signals in the cost function terms. The weighting coefficients $\gamma_1$ and $\gamma_2$ were described previously.

Using matrix/vector notation, the output in terms of the equalizer coefficients $h_1$ and $h_2$ may be written as follows:

$$y_h(n) = w_{h1}(n) + w_{h2}(n)$$
$$= V_{h1}(n)h_1 + V_{h2}(n)h_2$$
$$= [V_{h1}(n), V_{h2}(n)]\begin{bmatrix}h_1\\h_2\end{bmatrix}$$
$$= V_h(n)h$$

where $w_{h1}(n)$ and $w_{h2}(n)$ are the output signal vectors of the equalizers and $$V_{h1}(n) = \begin{bmatrix}v_{h1}(n) & 0 & 0\\v_{h1}(n-1) & v_{h1}(n) & \\ & & \\V_{h1}(n-_0N_s+1) & & \\0 & & \end{bmatrix}$$

$$V_{h2}(n) = \begin{bmatrix}v_{h2}(n) & 0 & 0\\v_{h2}(n-1) & v_{h2}(n) & \\ & & \\V_{h2}(n-_0N_s+1) & & \\0 & & \end{bmatrix}$$

which are similar in form to $V_{g1}(n)$ and $V_{g2}(n)$ matrices given above.

Original Cost Function

Consider the component $C_{21}(n)$, which is the cost function of the original algorithm. Substituting the output in terms of the equalizer coefficients $h_1$ and $h_2$ into the cost function $C_{21}(n)$ $$C_{21}(n) = \|\alpha_{21}u(n) - V_h(n)h\|^2$$
$$= [\alpha_{21}u^T(n) - h^T V_h(n)][\alpha_{21}u(n) - V(n)h]$$

Differentiating with respect to h yields $$\frac{\partial C_{21}(n)}{\partial h} = -2V_h(n)u(n) + 2V_h^T(n)V_h(n)h$$

Solving $\partial C_{21}(n)/\partial h=0$ gives the following (partial) LS solution for the equalizer coefficients:

$$[V_h^T(n)V_h(n)]h=[\alpha_{21}V_h(n)u(n)]$$

which we will represent by $$R_{21}(n)h=P_{21}(n)$$

As was done for the amplifier models, the partial LS solution can be written in terms of the two channel coefficient vectors separately, as follows:

$$\begin{bmatrix} V_{h1}^T T(n)V_{h1}(n)V_{h1}^T(n)V_{h2}(n) \\ V_{h2}^T(n)V_{h1}(n)V_{h2}^T(n)V_{h2}(n) \end{bmatrix} \begin{bmatrix} h_1 \\ h_2 \end{bmatrix} = \begin{bmatrix} \alpha_{21} V_{h1}^T(n)u(n) \\ \alpha_{21} V_{h2}^T(n)u(n) \end{bmatrix}$$

Least-Squares Constraints

For the cost function in $C_{21}(n)$ given above, it can be written $$C_{22}(n)=\|\alpha_{22}x_1(n)-V_{h1}(n)h_1\|^2$$

Similarly, for $C_{21}(n)$ given above, it can be written $$C_{23}(n)=\|\alpha_{23}x_2(n)-V_{h2}(n)h_2\|^2$$

It is clear from the result in the (partial) LS solution for the equalizer coefficients that $C_{23}(n)$ and $C_{24}(n)$ given above are minimized, respectively, by $$[V_{h1}^T(n)V_{h1}(n)]h_1=[\alpha_{22}V_{h1}^T(n)X_1(n)]$$

$$[V_{h2}^T(n)V_{h2}(n)]h_2=[\alpha_{23}V_{h2}^T(n)X_2(n)]$$

Observe that the components on the left-hand side of these expressions correspond to the diagonal components on the left-hand side of the LS solution for the equalizer coeficients (written in terms of two channel coefficient vectors). Thus, the equations above may be combined in a similar manner, yielding the partial LS solution $$\begin{bmatrix} V_{h1}^T(n)V_{h1}(n) & 0 \\ 0 & V_{h2}^T(n)V_{h2}(n) \end{bmatrix} \begin{bmatrix} h_1 \\ h_2 \end{bmatrix} = \begin{bmatrix} \alpha_{22}V_{h1}^T(n)x_1(n) \\ \alpha_{23}V_{h2}^T(n)x_2(n) \end{bmatrix}$$

which will be represented by $$R_{22}(n)h=P_{22}(n)$$

Note that $u(n)$ in the (partial) LS solution is replaced by $x_1(n)$ and $x_2(n)$ in the equation for the LS solution given above. Recall that $C_{22}(n)$ and $C_{23}(n)$ are weighted by the same coefficient $(1-\gamma_1)\gamma_2$.

Zero-Forcing Constraints

The two remaining cost functions, $C_{24}$ and $C_{25}$, are zero-forcing constraints; the equalizers are computed so that the combined equalizer/system model 700 yields a delta function as discussed previously. The cost functions in $C_{24}$ and $C_{25}$ given above are not written as functions of n to emphasize that they do not depend directly on the data like the other cost functions. Using the previously used notation, the partial LS solutions may be written as follows:

$$[\hat{G}_1^T\hat{G}_1]h_1=\alpha_{24}\hat{G}_1^T 1$$

$$[\hat{G}_1^T\hat{G}_1]h_2=\alpha_{25}\hat{G}_1^T 1$$

where $$\hat{G}_1 = \begin{bmatrix} \hat{g}_{1,1} & 0 & 0 \\ \hat{g}_{1,2} & \hat{g}_{1,1} & \\ \hat{g}_{1,0N_g} & & \\ 0 & & \end{bmatrix}$$

$$\hat{G}_2 = \begin{bmatrix} \hat{g}_{2,1} & 0 & 0 \\ \hat{g}_{2,2} & \hat{g}_{2,1} & \\ \hat{g}_{2,0N_g} & & \\ 0 & & \end{bmatrix}$$

and $1^T=[0,\ldots,0,1,0,\ldots,0]$; the location of the one in this vector is specified by the delays of the equalizer and the system model 700. Combining the terms in yields the following expression:

$$[\hat{G}_1^T\hat{G}_1]h_1=\alpha_{24}G_1^T 1$$

$$[\hat{G}_2^T\hat{G}_2]h_2=\alpha_{25}G_2^T 1$$

which can be represented as $$R_{23}h=P_{23}$$

Note that both zero-forcing constraints are weighted by $(1-\gamma_1)(1-\gamma_2)$.

Enhanced Equalizer Coefficients

At this point, the partial LS solutions has been specified for the original set of individual cost functions given above. Thus, combining the results in with the appropriate weighting of $\gamma_1$ and $\gamma_2$, the optimal equalizer coefficients are computed by solving the following linear system of equations:

$$[\gamma_1 R_{21}(n)+(1-\gamma_1)\gamma_2 R_{22}(n)+(1-\gamma_1)(1-\gamma_2)R_{23}]h=[\gamma_1 P_{21}(n)+(1-\gamma_1)\gamma_2 P_{22}(n)+(1-\gamma_1)(1-\gamma_2)P_{23}]$$

Figure 9:
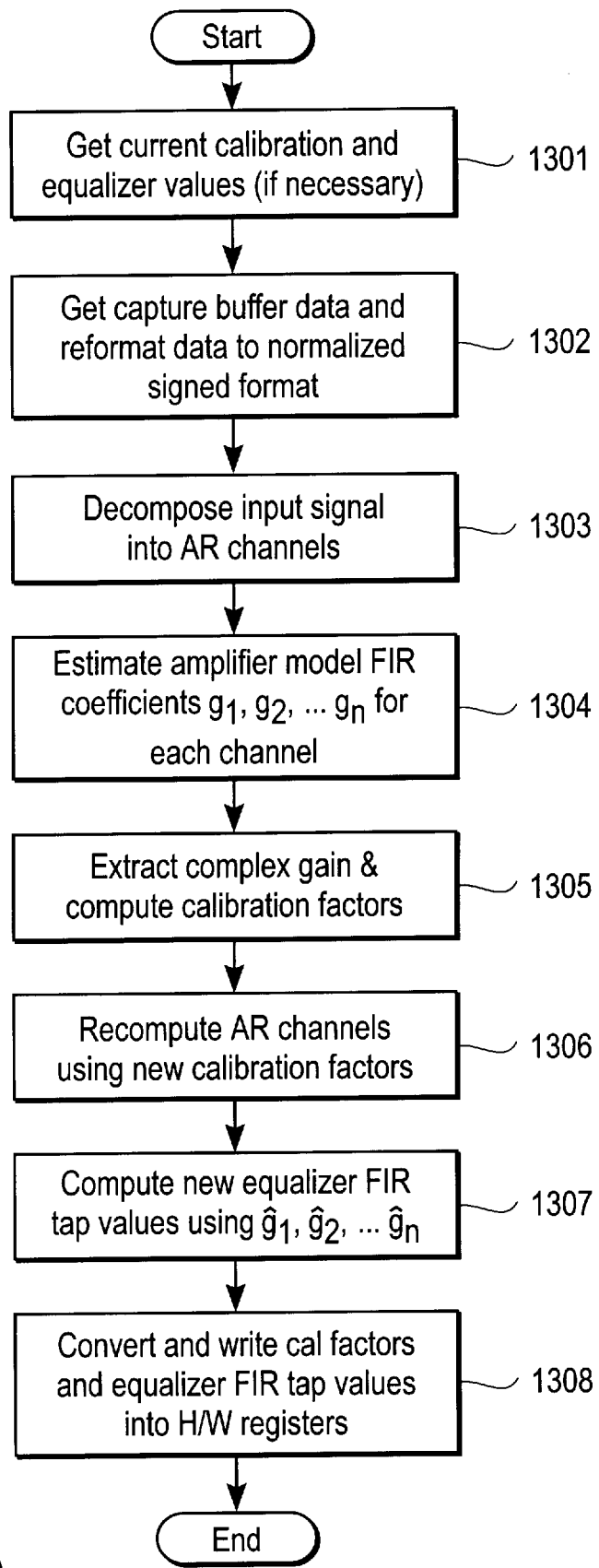
FIG. 9 is a flow diagram of one embodiment of a calibration process.

Recall that the gain coefficients $\alpha_{ij}$ are embedded in the $P_{ij}$ (cross-correlation) vectors. By varying the weightings $\gamma_i$, how much the solution depends on the original cost function versus the new cost functions (constraints) defined separately for each channel may be controlled. There are three special cases:

1) Original LS Equalizer: $\gamma_1=1$: $R_{21}(n)h=P_{21}(n)$
2) Separate LS Equalizers: $\gamma_1=0$ and $\gamma_2=1$: $R_{22}(n)h=P_{22}(n)$
3) Zero-Forcing Equalizers: $\gamma_1=0$ and $\gamma_2=0$: $R_{23}h=P_{23}$ Calibration Procedure Flow One embodiment of the calibration procedure is shown in FIG. 9. In one embodiment, the calibration procedure is performed by deducted processing hardware. This processing hardware may comprise hardware, such as, for example, digital or analog circuitry or, software, such as, for example, that which runs on a general purpose or dedicated machine, or a combination of both hardware and software. In one embodiment, the processing logic comprises controller 1101.

Referring to FIG. 9, the calibration procedure begins by processing logic obtaining the current equalizer values (processing block 1301). The current equalizer values comprise normalized equalizer FIR tap values for each channel. In one embodiment, separate matrices of the current equalizer values are maintained. In an alternate embodiment, a single matrix may be used instead of the two matrices. In still another embodiment, the values may be stored in registers or any other type of memory.

Next, processing logic obtains the capture buffer data and reformats the data to a normalized signal format (processing block 1302). If the data are captured in a normalized signal format, then the reformatting is not necessary. In one embodiment, four thousand samples are stored in the capture buffer (e.g., buffer memory 330). The capture buffer stores the samples in a matrix form.

After capturing the buffer data and performing reformatting, processing logic decomposes the input signal into an amplitude reconstruction channel pair (processing block 1303). In one embodiment, the results of the decomposition produces the baseband waveforms for both channels ($x_1(n)$ and $x_2(n)$) as well as the baseband waveforms after the equalizer.

With the decomposition complete, processing logic estimates the model FIR coefficient (tap) values for each channel (processing block 1304). As discussed above, these are the $\hat{g}_1$ and $\hat{g}_2$, values. The FIR tap values attempt to make the two or "N" amplitude reconstruction channels all alike. In one embodiment, the processing logic estimates the model FIR coefficients using the baseband waveforms after the equalizer and the delays of actual amplifier 600 and amplifier model 700.

Using the baseband waveforms, processing logic recomputes the amplitude reconstruction channel pair (processing block 1306). This channel pair comprises the baseband waveforms that appear at the output of the equalizer.

Using the amplitude reconstruction waveforms that appear at the output of the amplifiers for both channels and the output of the combiner, processing logic computes new equalizer FIR tap values using the model FIR tap values for both channels (processing block 1307).

Lastly, processing logic converts and writes the new equalizer FIR tap values into hardware registers (processing block 1308). The hardware registers are accessed by actual amplifier 600 to linearize itself as described above.

Therefore, embodiments described herein provide high power amplification of signal or multiple RF carriers with low intermodulation distortion within a cellular AMPS base station using the existing AMPS single carrier amplifiers.

Such embodiments may provide linear amplification for CDMA and GSM carriers or other digital carriers. The linear application uses the precision of digital signal processors and provides the linear amplification in the digital domain without any critical periodic tuning or alignment. In this manner, embodiment(s) described herein provide amplification of one or more than RF carriers and transmits them from an antenna using saturated or nearly saturated amplifiers.

The linearization described herein may be applied to audio frequency amplifiers as well.

Thus, a technique is described for multi-carrier signal amplification for wireless base stations where multiple saturated or nearly saturated amplifiers are used to implement a linear amplifier. With one embodiment, other protocols such as, for example, CDMA, can be superimposed on a base station, such as an AMPS base station.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Many other variations are possible. For example, the amplifier may be a single amplifier or multiple amplifiers as described or may comprise a number of amplifiers configured to act as a single amplifier. The application may be that of cellular, PCS, or any other frequency range that one may consider. It can be used for wireless local loops, smart antennas, audio amplifiers, or radar applications. Therefore, references to details of various embodiments are not intended to limit the scope of the claims which in themselves recite only those features regarded as essential to the invention.

Thus, a linear amplification technique has been described.

We claim:

1. A calibration method for calibrating an amplifier comprising:
    decomposing the input signal into a channel pair by applying a nonlinear function to the input signal;
    modeling the amplifier to generate an estimated amplifier transfer function for each of N channels processing a decomposed version of an input signal; and
    computing equalizer values for equalizers that are applied to each of the N channels prior to amplification, wherein the computing of equalizer values are based on the estimated amplifier transfer function for each channel in conjunction with a plurality of error criteria combined with weighting from each of the plurality of error criteria.

2. The method defined in claim 1 wherein the N channels comprises a channel pair.

3. The method defined in claim 1 further comprising reducing the expected error between the amplifier and a model of the amplifier.

4. The method defined in claim 3 further comprising wherein the model is linear.

5. The method defined in claim 1 further comprising reducing the expected error between the amplifier and a linear model of the amplifier using the estimated amplifier transfer function for each channel.

6. A calibration method for calibrating an amplifier comprising:
    modeling the amplifier to generate an estimated amplifier transfer function for each of N channels processing a decomposed version of an input signal; and
    modeling the amplifier transfer functions as multiple FIR filters; and
    computing equalizer values for equalizers that are applied to each of the N channels prior to amplification, wherein the computing of equalizer values are based on the estimated amplifier transfer function for each channel in conjunction with a plurality of error criteria combined with weighting from each of the plurality of error criteria.

7. A calibration method for calibrating an amplifier comprising:
    modeling the amplifier to generate an estimated amplifier transfer function for each of N channels processing a decomposed version of an input signal; and
    computing equalizer values for equalizers that are applied to each of the N channels prior to amplification. wherein the computing of equalizer values are based on the estimated amplifier transfer function for each channel in conjunction with a plurality of error criteria combined with weighting from each of the plurality of error criteria wherein computing values comprises computing equalizer FIR tap values using amplifier model FIR tap values.

8. A calibration apparatus for calibrating an amplifier comprising:
    means for decomposing an input signal into N channels;
    means for modeling the amplifier to generate an estimated amplifier transfer function for each of the N channels; and
    means for computing equalizer values for equalizers that are applied to each of the N channels in the channel pair prior to amplification, wherein the computing of equalizer value is based on the estimated amplifier transfer function for each channel.

9. The apparatus defined in claim 8 wherein the means for decomposing the input signal comprises means for applying a nonlinear function to the input signal.

10. The apparatus defined in claim 8 further comprising means for reducing the expected error between the amplifier and a linear model of the amplifier.

11. The apparatus defined in claim 8 further comprising means for reducing the expected error between the amplifier and a linear model of the amplifier using the estimated amplifier transfer function for each channel.

12. The apparatus defined in claim 8 further comprising means for minimizing the expected error between the amplifier and a linear model of the amplifier.

13. The apparatus defined in claim 8 wherein the amplifier transfer functions comprise model FIR tap values.

14. The apparatus defined in claim 8 further comprising means for computing equalizer FIR tap values using amplifier model FIR tap values.

15. An architecture for calibration and equalization of an amplifier comprising:

a linear model of the amplifier having estimated linear transfer functions that are estimates of the actual transfer functions of the amplifier; and a controller coupled to the linear model and the amplifier to set up the equalizers in the amplifier based on the response of the linear model to calibrate the amplifier, wherein the controller generates FIR coefficients to set up the equalizers.

16. The architecture defined in claim 15 wherein the model amplifier models the estimated amplifier transfer functions as multiple FIR filters.

17. The architecture defined in claim 15 wherein the controller determines FIR coefficients based on the response of the multiple FIR filters in the system.

18. The architecture defined in claim 15 wherein the controller generates the estimated amplifier transfer functions and uses the estimated amplifier transfer functions to estimate the equalization necessary to balance the channels.

\* \* \* \* \*

UNITED STATES PATENT AND TRADEMARK OFFICE
CERTIFICATE OF CORRECTION

PATENT NO. : 6,215,354 B1
DATED : April 10, 2001
INVENTOR(S) : Kolanek et al.

It is certified that error appears in the above-identified patent and that said Letters Patent is hereby corrected as shown below:

Column 11,
Line 55, delete "$V_{v^2}$" and replace with -- $V_{g^2}$ --.

Column 13,
Line 48, in the equation delete "(1γy$_2$)" and replace with -- $(1 - \gamma_2)$ --.

Signed and Sealed this

Twenty-sixth Day of March, 2002

Attest:

JAMES E. ROGAN
*Attesting Officer*   *Director of the United States Patent and Trademark Office*